US007932774B2

(12) United States Patent
Bonaccio et al.

(10) Patent No.: US 7,932,774 B2
(45) **Date of Patent: *Apr. 26, 2011**

(54) STRUCTURE FOR INTRINSIC RC POWER DISTRIBUTION FOR NOISE FILTERING OF ANALOG SUPPLIES

(75) Inventors: Anthony R. Bonaccio, Shelburne, VT (US); Hayden C. Cranford, Jr., Cary, NC (US); Joseph A. Iadanza, Hinesburg, VT (US); Sebastian T. Ventrone, South Burlington, VT (US); Stephen D. Wyatt, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

This patent is subject to a terminal disclaimer.

(21) Appl. No.: 12/053,958

(22) Filed: Mar. 24, 2008

(65) Prior Publication Data

US 2008/0244479 A1 Oct. 2, 2008

Related U.S. Application Data

(63) Continuation-in-part of application No. 11/276,451, filed on Feb. 28, 2006, now Pat. No. 7,449,942.

(51) Int. Cl.
*H03K 5/00* (2006.01)

(52) U.S. Cl. ......... 327/553; 327/532; 327/558; 327/552

(58) Field of Classification Search .......... 327/551–559, 327/530–532, 336–337
See application file for complete search history.

(56) References Cited

U.S. PATENT DOCUMENTS

| | | | | |
|---|---|---|---|---|
| 3,582,744 | A | 6/1971 | Coffey et al. | |
| 5,825,238 | A | 10/1998 | Poimboeuf et al. | |
| 5,852,359 | A | 12/1998 | Callahan, Jr. et al. | |
| 5,903,605 | A | 5/1999 | Crittenden | |
| 5,942,934 | A | 8/1999 | Ngo et al. | |
| 6,411,531 | B1 | 6/2002 | Nork et al. | |
| 6,603,293 | B2 | 8/2003 | Knoedgen | |
| 6,664,769 | B1 | 12/2003 | Haas | |
| 6,703,816 | B2 | 3/2004 | Biagi et al. | |
| 6,771,119 | B2 | 8/2004 | Ochi | |
| 6,803,813 | B1 * | 10/2004 | Pham | 327/553 |
| 6,842,710 | B1 | 1/2005 | Gehring et al. | |
| 7,023,248 | B2 * | 4/2006 | Ott | 327/143 |
| 7,339,442 | B2 * | 3/2008 | Godambe | 331/135 |
| 7,402,987 | B2 * | 7/2008 | Lopata | 323/282 |

OTHER PUBLICATIONS

P. Restle et al., IEEE International Solid-State Circuits Conference: Timing Uncertainty Measurements on the Power5 Microprocessor, 2004 Session 19, pp. 1-2.
Notice of Allowance for corresponding U.S. Appl. No. 12/196,718.

* cited by examiner

*Primary Examiner* — Dinh T. Le
(74) *Attorney, Agent, or Firm* — David Cain; Roberts Mlotkowski Safran & Cole, P.C.

(57) ABSTRACT

A design structure for intrinsic RC power distribution for noise filtering of analog supplies. The design structure is embodied in a machine readable medium for designing, manufacturing, or testing an integrated circuit. The design structure includes a voltage regulator; a variable resistor coupled to the voltage regulator; and a performance monitor and control circuit providing a feedback loop to the variable resistor.

14 Claims, 10 Drawing Sheets

STRUCTURE FOR INTRINSIC RC POWER DISTRIBUTION FOR NOISE FILTERING OF ANALOG SUPPLIES

CROSS REFERENCE TO RELATED APPLICATIONS

The present application is a continuation-in-part of application Ser. No. 11/276,451, filed on Feb. 28, 2006 now U.S. Pat. No. 7,449,942, the contents of which are incorporated by reference in their entirety herein.

FIELD OF THE INVENTION

The present invention relates to a design structure for an RC network, and more particularly a design structure for maximizing noise filtering or optimizing performance through the RC network.

BACKGROUND OF THE INVENTION

Analog circuit performance can be adversely affected by supply noise of a voltage source. To reduce the noise associated with the voltage signal, filter networks have been utilized. However, care must be taken to ensure that the filter network necessary to reduce the noise does not decrease the supply voltage to unusable levels.

Attempts have been made to minimize the effects of supply noise on sensitive analog circuits by arranging a filtering network next to silicon. Moreover, filtering can be arranged at board, package or die, whereby a filtered supply voltage is applied to the analog circuit.

The most effective filters have low cut-off frequencies, i.e., high RC value for traditional RC low-pass filters. However, a high resistance value induces excessive IR drop, such that a voltage sufficient for operating the circuit is not supplied, which can result in performance degradation or inoperability.

Managing integrated passive filter components for negligible IR drop does not provide optimal filtering of low frequency noise. These filters produce some attenuation but noise remaining after filtering can still be too great. An RC network is shown in FIG. 1, where AVdd is the supply voltage and AVdd_RC is the filtered supply. C is an intrinsic analog supply capacitance to ground, e.g., an N-well to substrate parasitic capacitance, and can be, e.g., 100 pF, and R is composed of a typical package and die wiring, which can be, e.g., 5Ω. For the instant example, it is assumed that the minimum tolerable voltage for the analog circuit is 1.4V, such that supply voltage AVdd is selected to be, e.g., 1.5 V. However, supply voltage AVdd, shown in the left-hand graph, also includes peak-to-peak noise of 400 mV. Thus, when supply voltage AVdd is filtered through the RC network, the expected voltage loss through the network produces an acceptable average voltage of, e.g., 1.45 V, see right-hand graph. However, the peak-to-peak noise of 90 mV applied to the analog circuit remains too high and may degrade performance.

As R is increased in known filtering, effective noise filtering is achieved through a reduced filter bandwidth, however, filtered supply AVdd_RC is also reduced to unusable levels. The RC network shown in FIG. 2, where C again is an intrinsic analog supply capacitance to ground, e.g., an N-well substrate, and can be, e.g., 100 pF. However, R is increased for maximum cut-off frequency to provide sufficient noise filtering, e.g., 33Ω. As with the previous example of FIG. 1, it is assumed that the minimum tolerable voltage for the analog circuit is 1.4V, such that the supply voltage AVdd of, e.g., 1.5 V with peak-to-peak noise of 400 mV, is utilized, see left-hand graph. Thus, when supply voltage AVdd is filtered through the RC network, the noise amplitude is reduced by three times to, e.g., 30 mV. However, as shown in the right-hand graph, the average filtered signal AVdd_RC of, e.g., 1.17 V is too low for operating the analog circuit.

To avoid the above-noted drawbacks of the filter networks, a voltage regulator, e.g., a linear regulator or a switched regulator, has been employed for analog supply creation. As shown in FIG. 3, a regulator 10 supplies a supply voltage AVdd to an analog circuit 20. Regulator 10 can be formed by a generator 11 supplying a reference voltage Vref, which is the nominal AVdd required by analog circuit 20. Reference voltage Vref and supply voltage AVdd are input to an operational amplifier 12. The output of operational amplifier 12 is coupled to supply AVdd to analog circuit 20 through field effect transistor (FET) 13. A supply voltage AVcc, which is somewhat higher than AVdd, is applied to FET 13, operational amplifier 12, and generator 11. While this solution provides sufficient voltage for operating analog circuit 20, the solution does not sufficiently reduce noise in the supply signal, AVdd.

To address the noted deficiency in the voltage regulator solution, an RC filtering network 15, shown in FIG. 4, is provided to filter AVdd to supply filtered signal AVdd_RC to analog circuit 20. Moreover, it is noted that filtered signal AVdd_RC is fed back to operational amplifier 12. Thus, the maximum available IR drop becomes AVdd-Avdd_RC. Further, filter network 15 utilizes the intrinsic capacitance of the chip structure, due to n-well, nFETs, etc., which is represented as capacitor 17. However, this arrangement does not allow noise filtering to be maximized.

SUMMARY OF THE INVENTION

The present invention is directed to a design structure embodied in a machine readable medium for designing, manufacturing, or testing an integrated circuit. The design structure comprises a analog power supply. The design structure comprises a voltage regulator, a variable resistor coupled to the voltage regulator, and a performance monitor and control circuit providing a feedback loop to the variable resistor.

The present invention is directed to a design structure embodied in a machine readable medium for designing, manufacturing, or testing an integrated circuit. The design structure comprises a analog power supply. The design structure comprises a noise filter having a variable resistor, and a control device coupled to adjust the variable resistor. The control device is structured and arranged to set the resistance of the variable resistor to one of maximize noise filtering or optimize performance of the analog circuit.

DETAILED DESCRIPTION OF THE EMBODIMENTS OF THE INVENTION

The present invention provides a design structure for an analog supply creation to an analog circuit through an RC network for noise reduction, in which the IR drop is maximized without adversely impacting analog circuit operation. According to the invention, the design structure includes an RC network comprising an adjustable resistor that is set to maximize noise filtering by a control device.

Further, a control loop can be utilized to set the adjustable resistor based upon performance of the analog circuit, such that IR drop and cut-off frequency are optimized based upon a feedback loop from analog circuit output through a performance monitor, e.g., a jitter monitor for a phase-locked loop.

Figure 5:
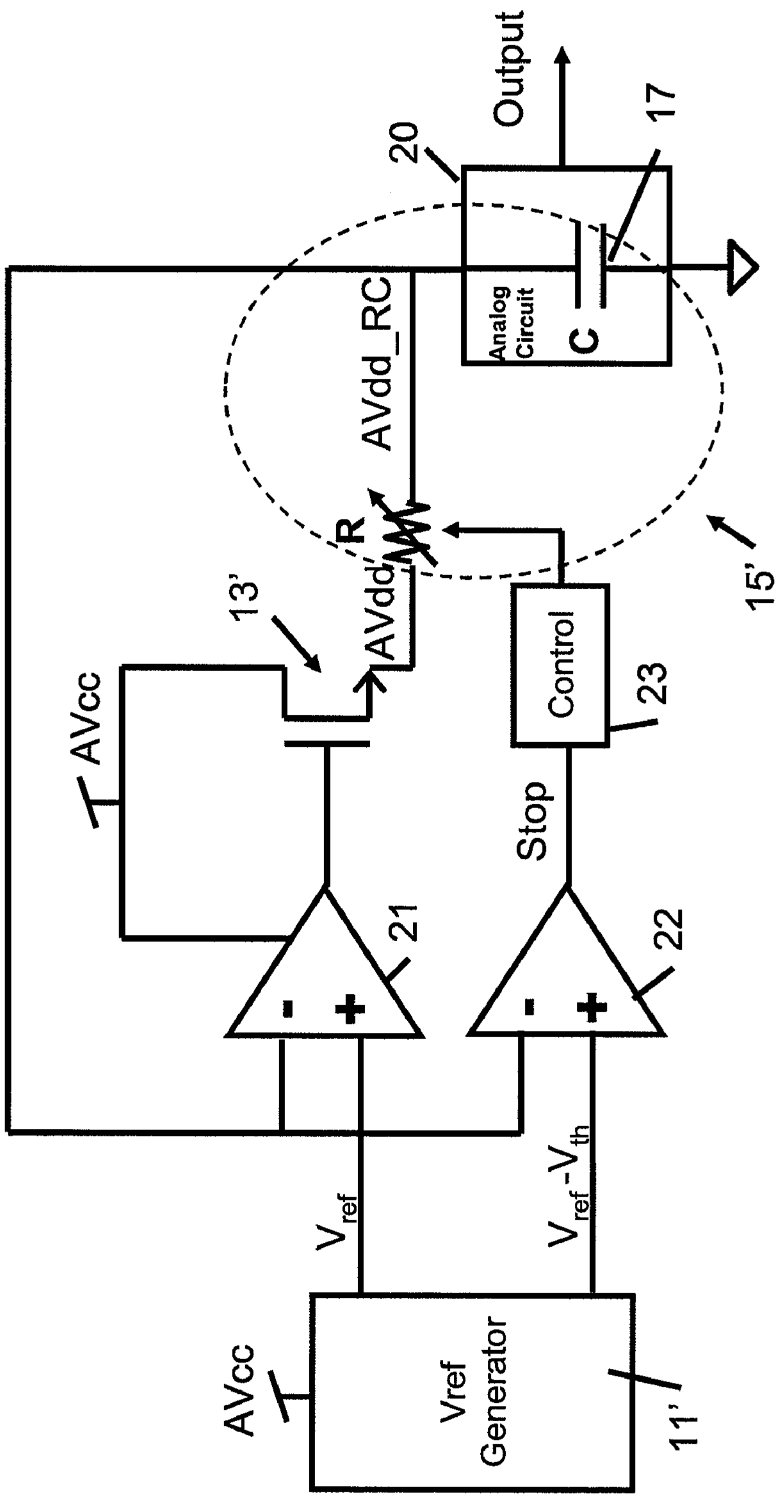
FIG. 5 schematically illustrates an exemplary embodiment for supplying a reduced noise signal to an analog circuit.

As shown in FIG. 5, a voltage regulator, e.g., a linear regulator or a switched regulator, includes a reference generator 11' supplying a reference voltage Vref, which is the nominal AVdd_RC required by analog circuit 20 which can be determined by simulating the analog circuit to find what minimum voltage is needed to provide the desired function and performance across all expected process and temperature excursions. Reference voltage Vref and supply voltage AVdd_RC are input to an operational amplifier 21. The output of operational amplifier 21 is coupled to FET 13' to supply AVdd to filter network 15', whereby a filtered supply AVdd_RC is supplied to analog circuit 20. A supply voltage AVcc, which is somewhat higher than AVdd, is applied to FET 13', operational amplifier 21, operational amplifier 22, and generator 11'. Filter network 15' is composed of a variable resistor R and capacitor 17 is composed of an intrinsic analog supply capacitance to ground of the chip, e.g., an N-well to substrate parasitic capacitance, and can be, e.g., 100 pF. Moreover, variable resistor R is under the control of a controller 23 which increases the resistance of variable resistor R until filtered supply AVdd_RC is equal to, or drops below, a predetermined hardstop generated by generator 11 as Vref-Vth. The hardstop voltage, Vref-Vth, detects the failure of operational amplifier 21 and FET 13' to maintain Avdd_RC at the nominal voltage of Vref. As such, the hardstop voltage indicates when the variable resistance R has been increased beyond the maximum value allowed by analog circuit 20. Vth is determined from circuit simulation and generally corresponds to the voltage step resulting from a single variable resistor R step. Hardstop Vref-Vth is compared to filtered supply AVdd_RC in operational amplifier 22 and generates a control signal STOP. Control 23 can be operated, e.g., with logic software, to decrease the variable resistance R by a single step, when STOP=1, to restore Avdd_RC to the nominal voltage Vref. Following this action, control 23 will detect STOP=0 and will cease updates to variable resistor R. In the exemplary embodiment, the resistance range for variable resistor R can be, e.g., 5-100Ω. However, the resistance range for variable resistor R, and, in particular, the maximum resistance, can be determined by the dc current pulled by the analog circuit connected to the filtered supply. Moreover, based upon the amount of current pulled by the analog circuit, the resistance may be incrementally increased under control of the controller in fine increments. In the exemplary embodiment, the resistance increment can be, e.g., 2-5Ω. However, the resistance increment for variable resistor R, can be determined by the requirements of the analog circuit and the practical limitations of the resistor structure.

In accordance with the above-noted features of the invention, the IR drop due to filter network 15' is maximized without adversely impacting the analog circuit supply AVdd_RC. Further, according to the present arrangement, the cut-off frequency is minimized. It is noted that variable resistor R, while shown in FIG. 5 as a single variable resistor, can be formed by a plurality of resistors without departing from the spirit and scope of the invention.

Figure 6:
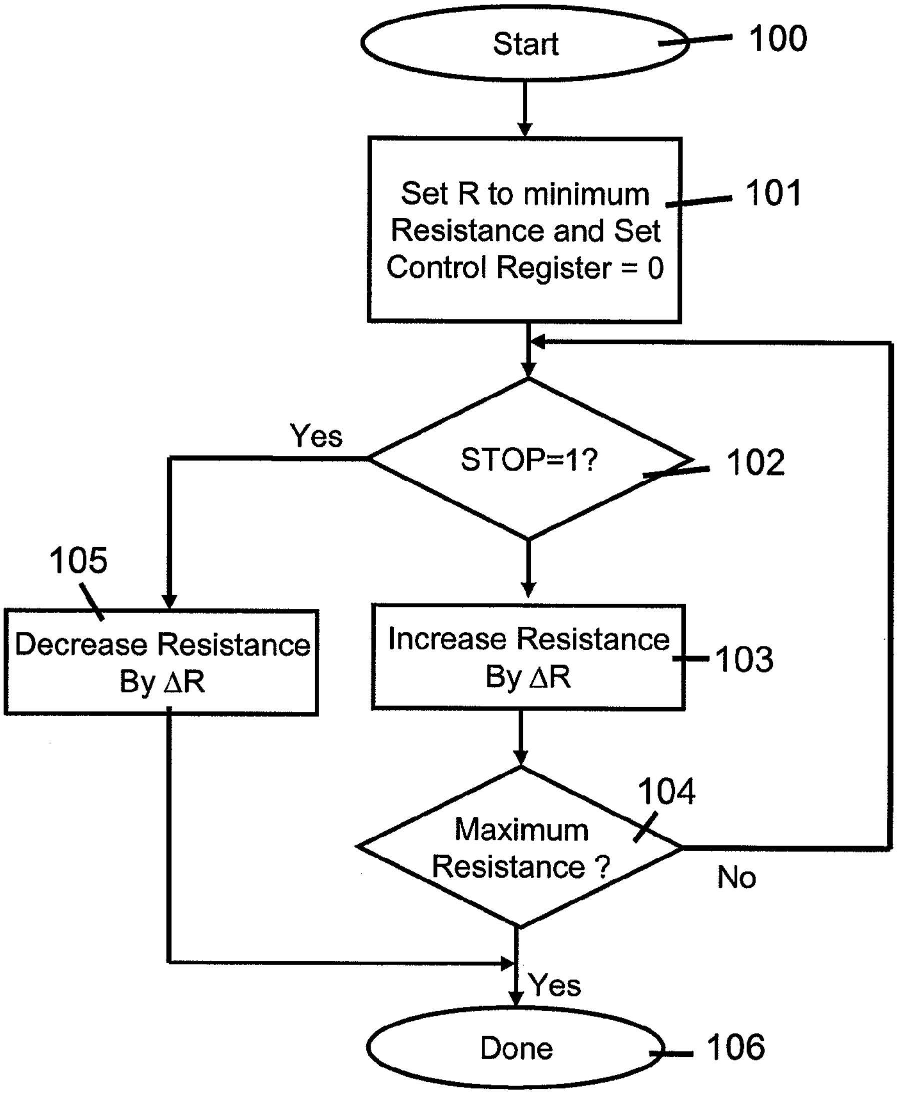
FIG. 6 illustrates a flow diagram for performing the process in accordance with the exemplary embodiment of the invention.

Exemplary logic software performed in the controller of FIG. 5 to select a value for R for maximum noise filtering is illustrated in the flowchart of FIG. 6. At step 100, the control program is initiated, and, at step 101, variable resistor R is set to its minimum resistance. In a next step 102, a determination is made whether AVdd_RC is equal or below hardstop Vref-Vth. A register is initially set to "0", but when AVdd_RC is equal to or below hardstop Vref-Vth, the register is changed to "1." When the register is "1," the process restores R to the previous value in step 105 and then ends at step 106, otherwise, the process continues to step 103 to increase the resistance of variable resistance R by a predetermined amount ΔR, e.g., 2-5Ω. The process, at step 104, determines whether the maximum resistance of variable resistor R has been attained. If not, the process returns to step 102 to check the register. If the maximum resistance is attained, the process ends at step 106. Thus, the controller sets variable resistor R to a maximum resistance to maintain the minimum voltage for operating analog circuit 20, which maximizes IR drop and minimizes cut-off frequency.

Figure 7:
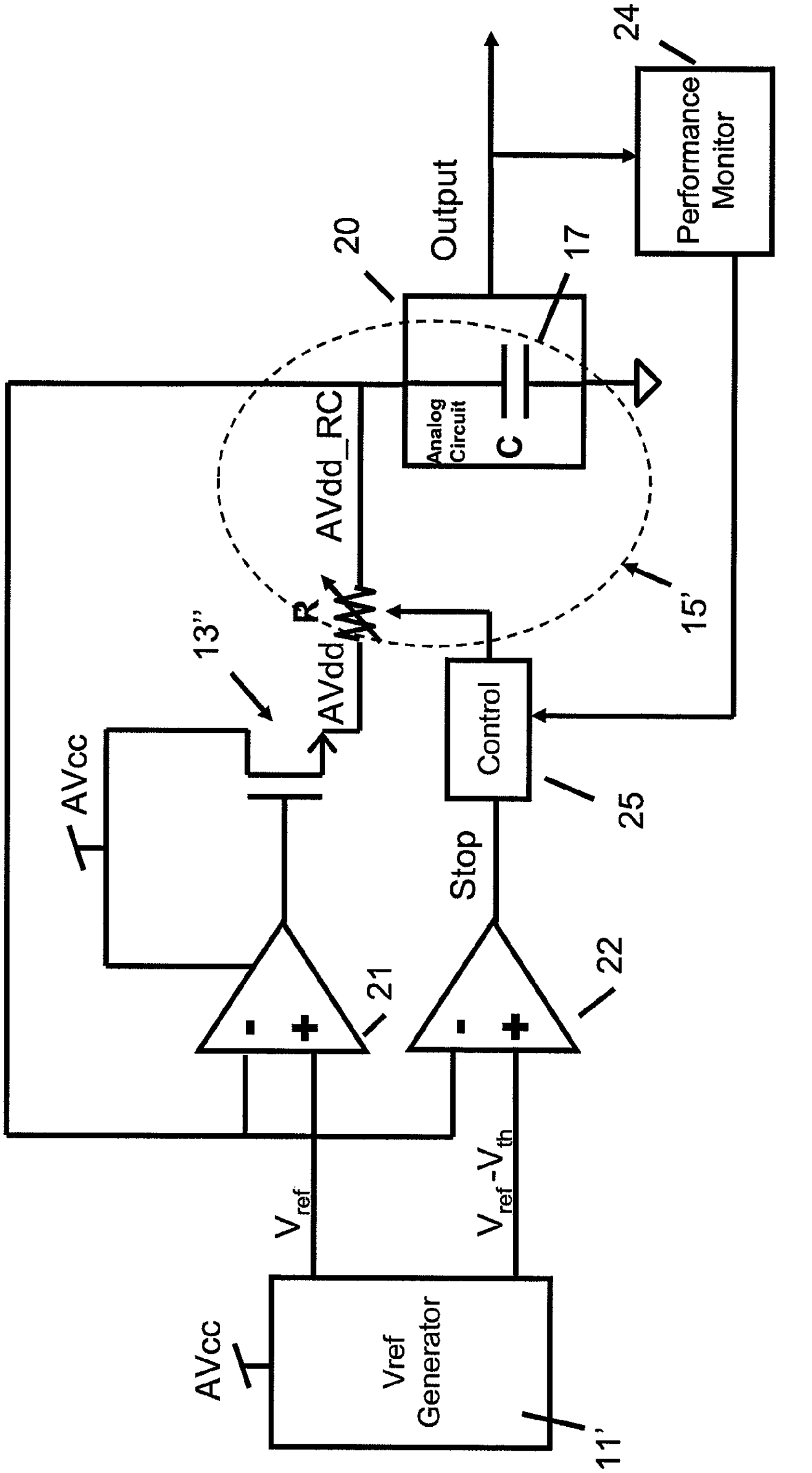
FIG. 7 schematically illustrates a further embodiment of the invention for supplying a reduced noise signal to an analog circuit.

An alternative to the embodiment shown in FIG. 5 is illustrated in FIG. 7, in which the variable resistor is set by a control loop for optimizing performance of the analog circuit. It is noted that common elements in FIGS. 5 and 7 are provided with the same reference numerals. A voltage regulator, e.g., a linear regulator or a switched regulator, includes reference generator 11" supplying a reference voltage Vref, which is the nominal AVdd_RC required by analog circuit 20 which can be determined by simulating the analog circuit to find what minimum voltage is needed to provide the desired function and performance across all expected process and temperature excursions. Reference voltage Vref and supply voltage AVdd_RC are input to operational amplifier 21, and the output of operational amplifier 21 is coupled to FET 13' to supply AVdd to filter network 15'. In this way, a filtered supply AVdd_RC is supplied to analog circuit 20. A supply voltage AVcc, which is somewhat higher than AVdd, is applied to FET 13', operational amplifier 21, operational amplifier 22, and generator 11'. Filter network 15' is composed of a variable resistor R and capacitor 17 is composed of an intrinsic analog supply capacitance to ground of the chip, e.g., an N-well to substrate parasitic capacitance, and can be, e.g., 100 pF. Moreover, variable resistor R is under the control of a controller 25 which, like control 23 in FIG. 5, increases the resistance of variable resistor R. However, in contrast to the FIG. 5 embodiment, controller 25 is coupled to a performance monitor 24 in order to monitor performance of analog circuit 20 and to increase the resistance of variable resistor R until performance of analog circuit 20 no longer improves, i.e., performance begins to degrade. The controller 25 can be operated, e.g., with logic software, and performance monitor 24 can be any circuit whose performance can be affected by supply noise, e.g., a phase locked loop with a jitter performance metric or an oscillator circuit. Thus, the resistance of variable resistor R can be incrementally increased as long as no performance degradation is detected. However, once performance is identified as degraded, controller 25 returns variable resistor R to the value just prior to the performance degradation. In the exemplary embodiment, the resistance range for variable resistor R can be, e.g., 5-100Ω. However, the resistance range for variable resistor R, and, in particular, the maximum resistance, can be determined by the dc current pulled by the analog circuit connected to the filtered supply. Moreover, based upon the amount of current pulled by the analog circuit, the resistance may be incrementally increased under control of the control 25 in fine increments. In the exemplary embodiment, the resistance increment can be, e.g., 2-5Ω. However, the resistance increment for variable resistor R, can be determined by the requirements of the analog circuit and the practical limitations of the resistor structure.

In accordance with the above-noted features of the present embodiment, the IR drop and cut-off frequency are optimized based on a performance monitor feedback loop. Again, it is noted that variable resistor R, while shown in FIG. 7 as a single variable resistor, can be formed by a plurality of resistors without departing from the spirit and scope of the invention.

Figure 8:
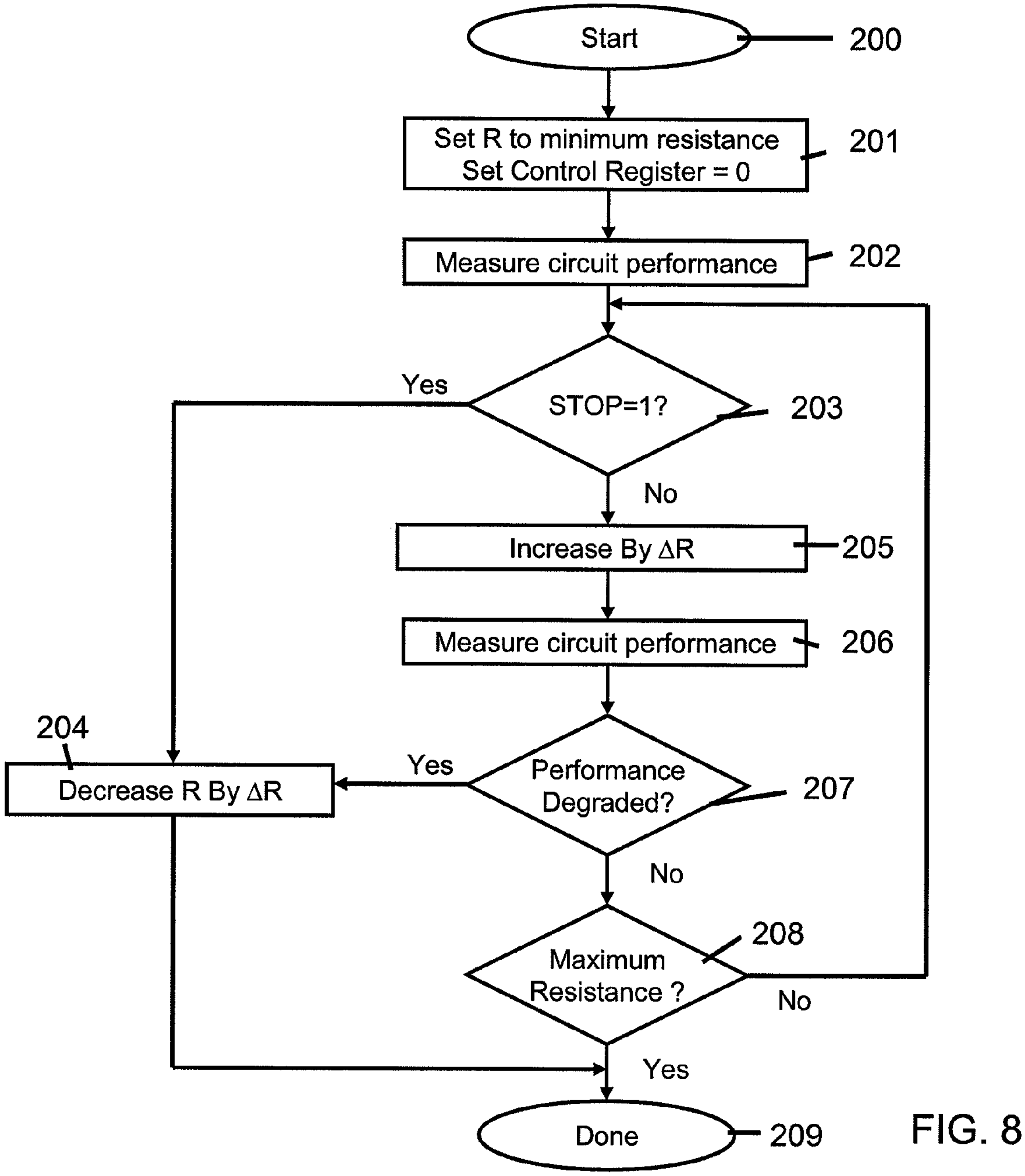
FIG. 8 illustrates a flow diagram for performing the process in accordance with the further embodiment of the invention.

Exemplary logic software performed in the control 25 of FIG. 7 to select a value for R for optimal circuit performance is illustrated in the flowchart of FIG. 8. At step 200, the control program is initiated, and, at step 201, variable resistor R is set to its minimum resistance. In a next step 202, performance of analog circuit 20 is measured, e.g., by a performance monitor 24, such as a jitter monitor for a PLL or other suitable device or process. The process continues to step 203, where a determination is made whether AVdd_RC is equal or below hardstop Vref-Vth. A register is initially set to "0", but when AVdd_RC is equal to or below hardstop Vref-Vth, the register is changed to "1." When the register is "1," the process restores R to the previous value in step 204 and then ends at step 209, otherwise, the process continues to step 205 to increase the resistance of variable resistance R by a predetermined amount ΔR, e.g., 2-5Ω. The process, at step 206, measures circuit performance, so that at step 207 a determination can be made whether performance is degraded. When performance is degraded at step 207, the process proceeds to step 204, whereby the resistance of variable resistor is decreased by ΔR, so that the resistance is returned to a value at which performance degradation was not detected, and then ends at step 209. If performance is not degraded at step 207, the process, at step 208, determines whether the maximum resistance of variable resistor R has been attained. If not, the process returns to step 203 to check the register. If the maximum resistance is attained, the process ends at step 209. Thus, the controller sets variable resistor R to a maximum resistance to ensure optimum IR drop and cut-off frequency while analog circuit performs at its optimum level.

Figure 1:
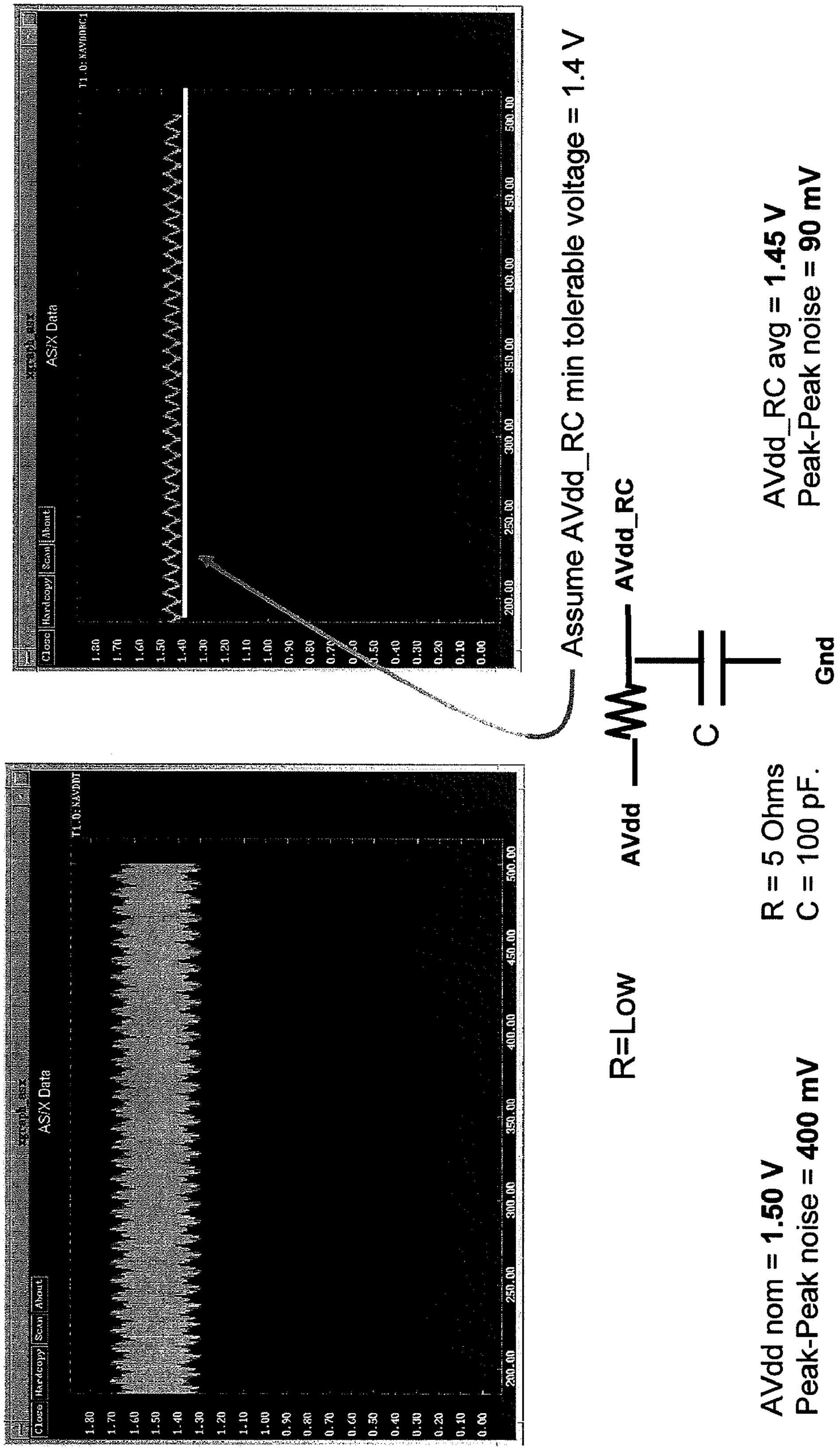
FIG. 1 schematically illustrates a conventional RC noise filtering network and graphically illustrates the supply and filtered signal levels and noise.
Figure 2:
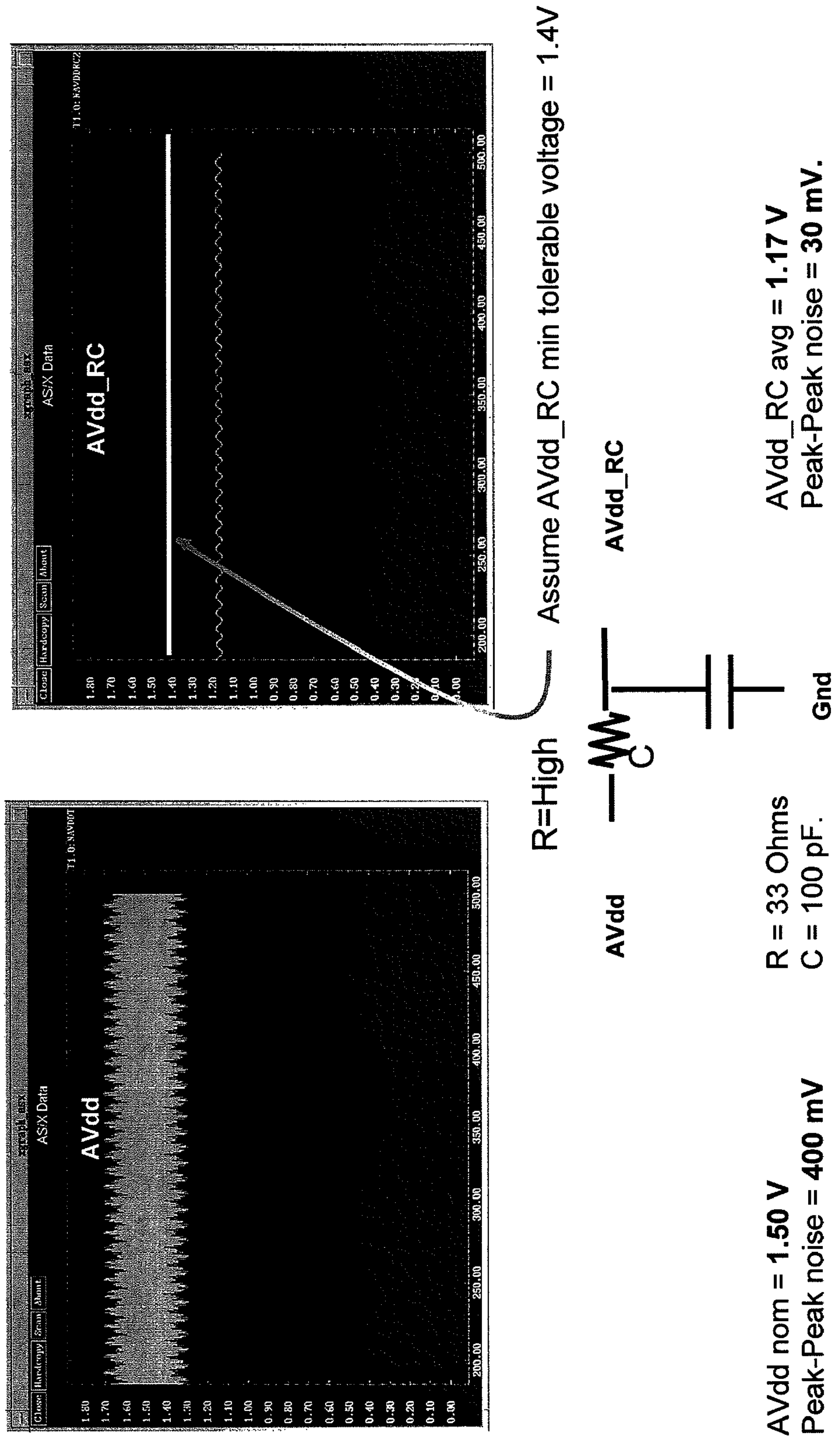
FIG. 2 schematically illustrates a conventional RC noise filtering network with a high R and graphically illustrates the supply and filtered signal levels and noise.
Figure 3:
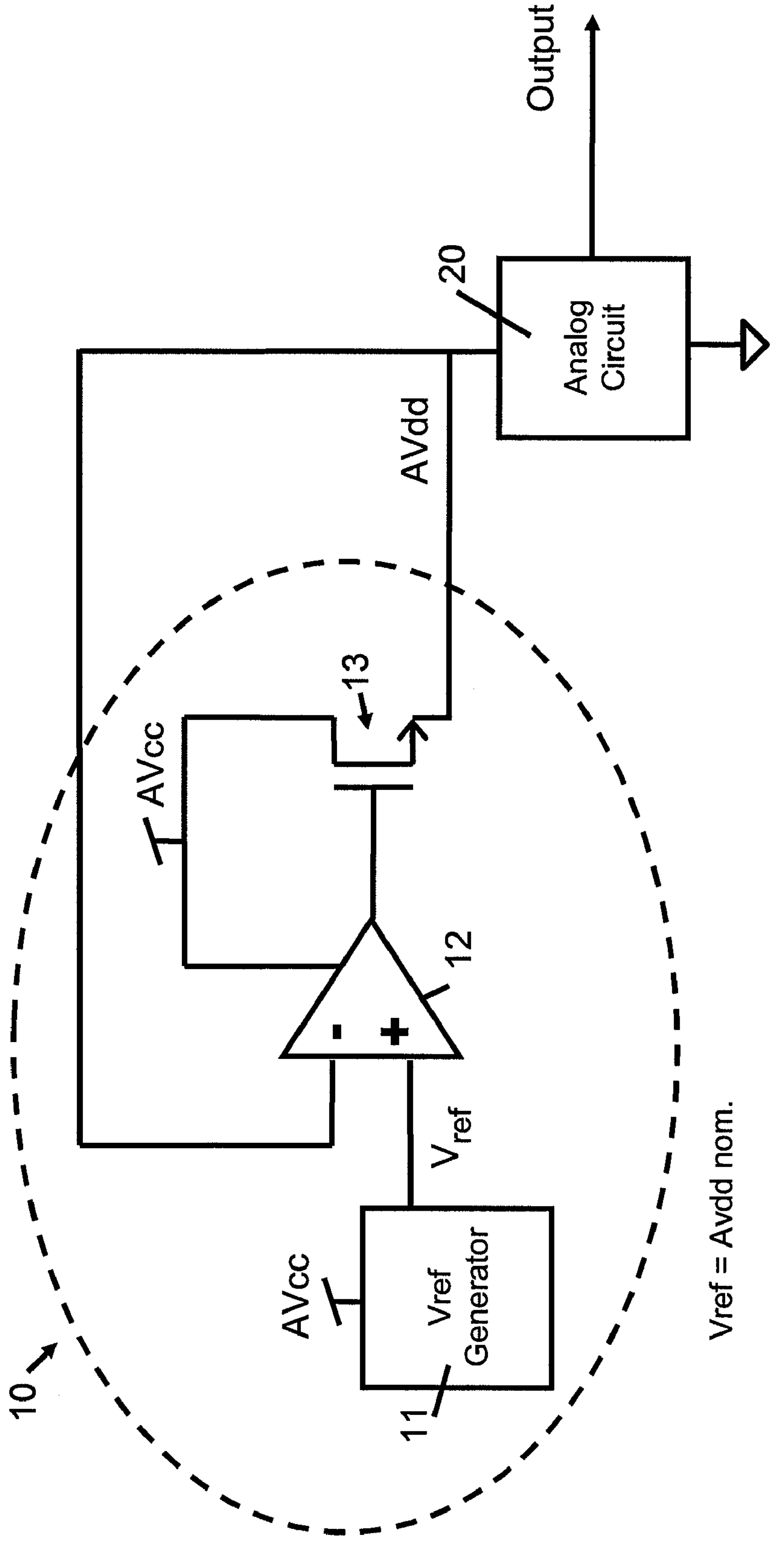
FIG. 3 schematically illustrates a conventional voltage regulator supplying a voltage signal to an analog circuit.
Figure 4:
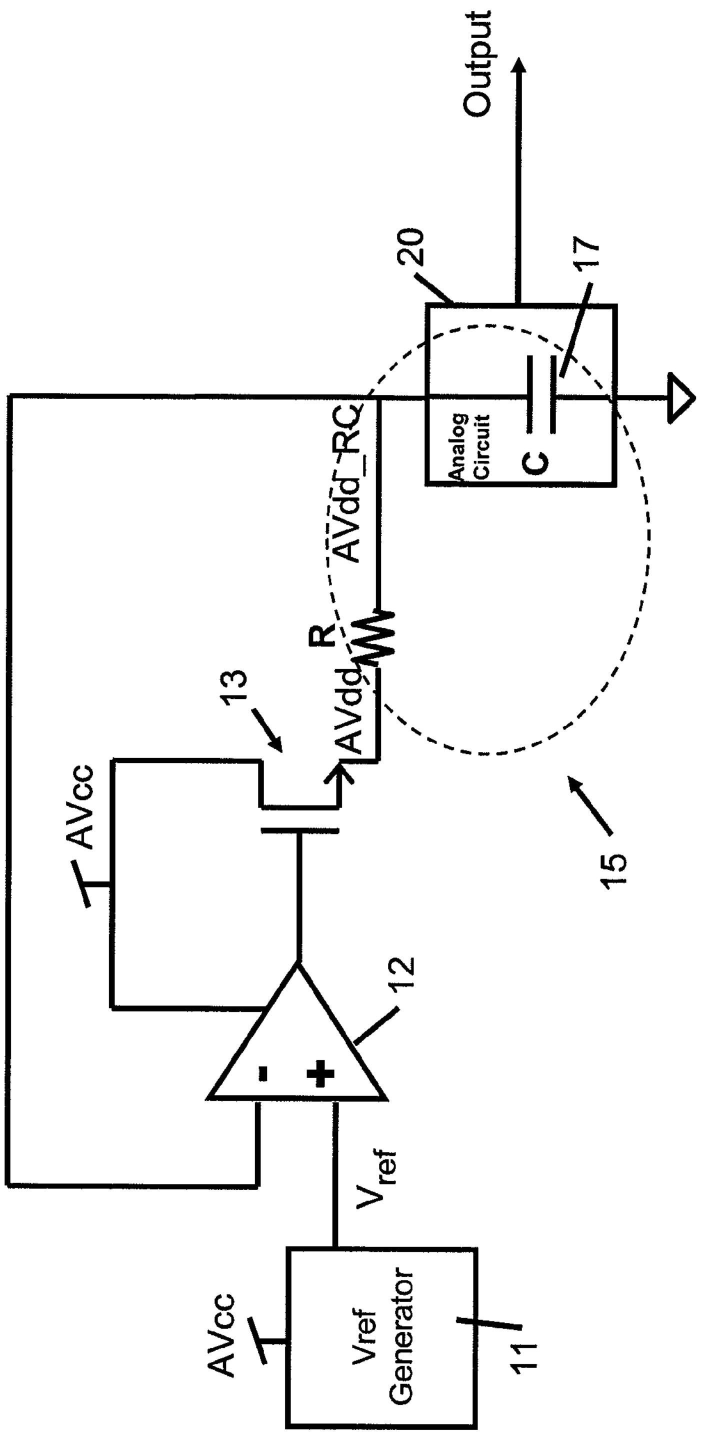
FIG. 4 schematically illustrates a conventional voltage regulator with RC noise filtering supplying a filtered supply signal to an analog circuit.
Figure 9:
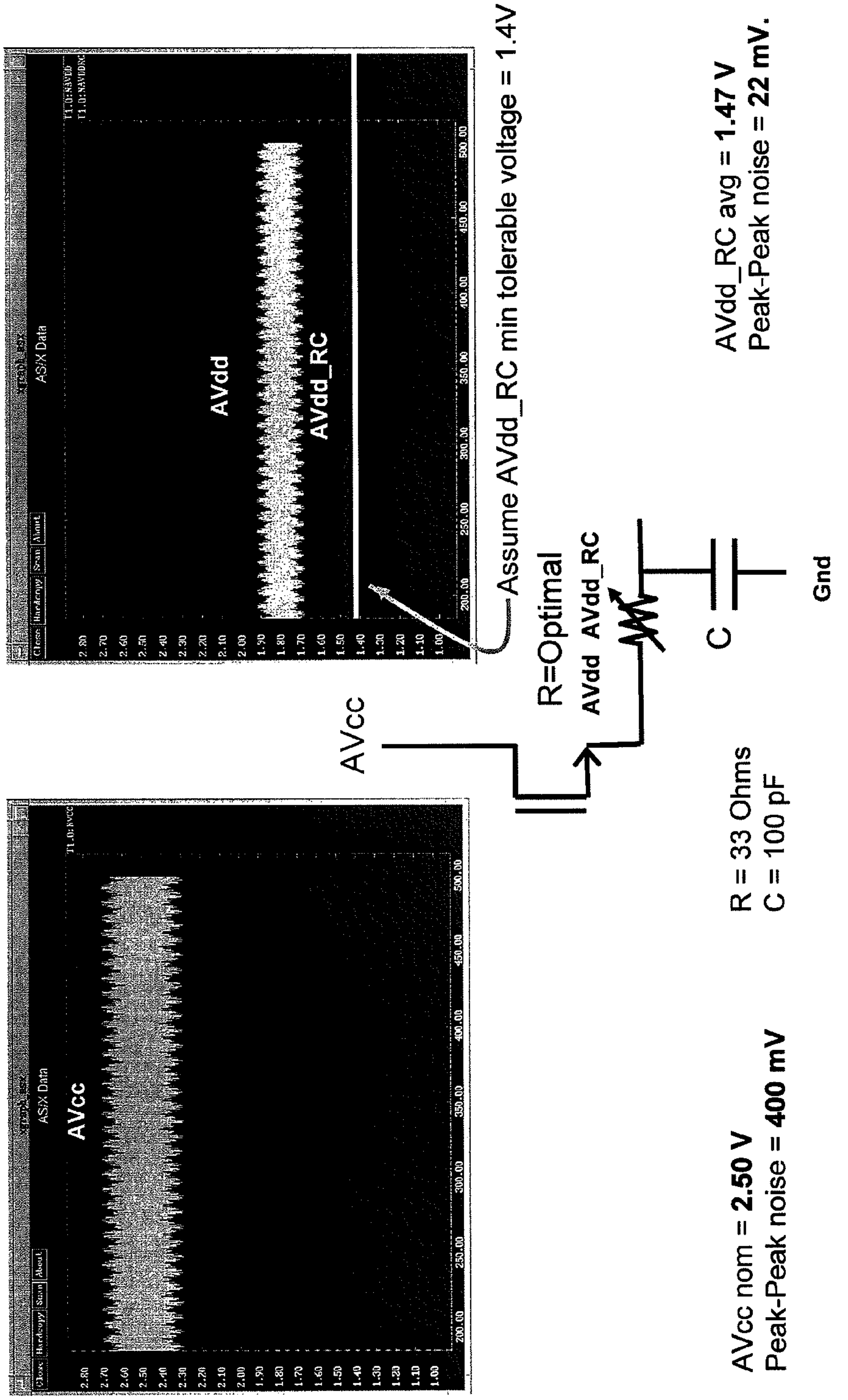
FIG. 9 schematically illustrates regulator and variable resistor RC noise filtering network in accordance with the present invention and graphically illustrates the supply and filtered signal levels and noise.

FIG. 9 schematically illustrates an RC network that generally corresponds to filter network 15' composed of a variable resistor and capacitor, depicted in FIGS. 5 and 7, and graphically illustrates supply voltage AVcc, supply voltage AVdd, filtered supply AVdd_RC, and the minimum tolerable voltage for the analog circuit. Again, while C can be an intrinsic analog supply capacitance to ground, e.g., an N-well to substrate parasitic capacitance, and can be, e.g., 100 pF, a variable resistor R is utilized. As with the analog circuit assumed in FIGS. 1 and 2, the minimum tolerable voltage for the analog circuit is assumed to be 1.4V. Moreover, as shown in the left-hand graph, a supply source produces a supply AVcc of, e.g., 2.5 V with 400 mV peak-to-peak noise, and the regulator of the instant invention produces a supply AVdd, before the filter network, having an average of 1.8 V and 200 mV peak-to-peak noise, see the right-hand graph. As discussed above, the variable resistor R is initially set to a minimum resistance, and the resistance is increased until either the hardstop of Vref-Vth is attained or passed or the monitored performance of the analog circuit is degraded. Once the variable resistor of the filter network is set, e.g., at 33Ω, the average AVdd_RC (filtered AVdd) is 1.47 V, above the minimum tolerable voltage of 1.4 V, with peak-to-peak noise of 22 mV. Thus, the present invention reduces noise amplitude, while supplying a filtered supply AVdd_RC in the usable range.

According to the present invention, the filter network 15' can be integrated onto the same chip as the analog circuit. In this manner, the filter networks are able to take advantage of the n-well to substrate parasitic capacitance to form the capacitor for the filter network with the variable resistor. Moreover, it is contemplated that the voltage regulator can also be integrated onto the chip with the filter network and analog circuit.

Alternatively, it is also contemplated that the filter network 15' can be integrated on a separate chip from the analog circuit. In this manner, the filter network cannot advantageously utilize the intrinsic capacitance of the analog circuit chip. Therefore, when integrated on a separate chip, the filter network can preferably be formed with an appropriate capacitance, e.g., a 100 μF capacitor, which will be arranged in parallel with the analog circuit. Further, the voltage regulator can be integrated onto the chip with the filter network, or can be integrated onto a separate chip.

The circuit as described above is part of the design for an integrated circuit chip. The chip design is created in a computer-aided electronic design system, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Design Structure

Figure 10:
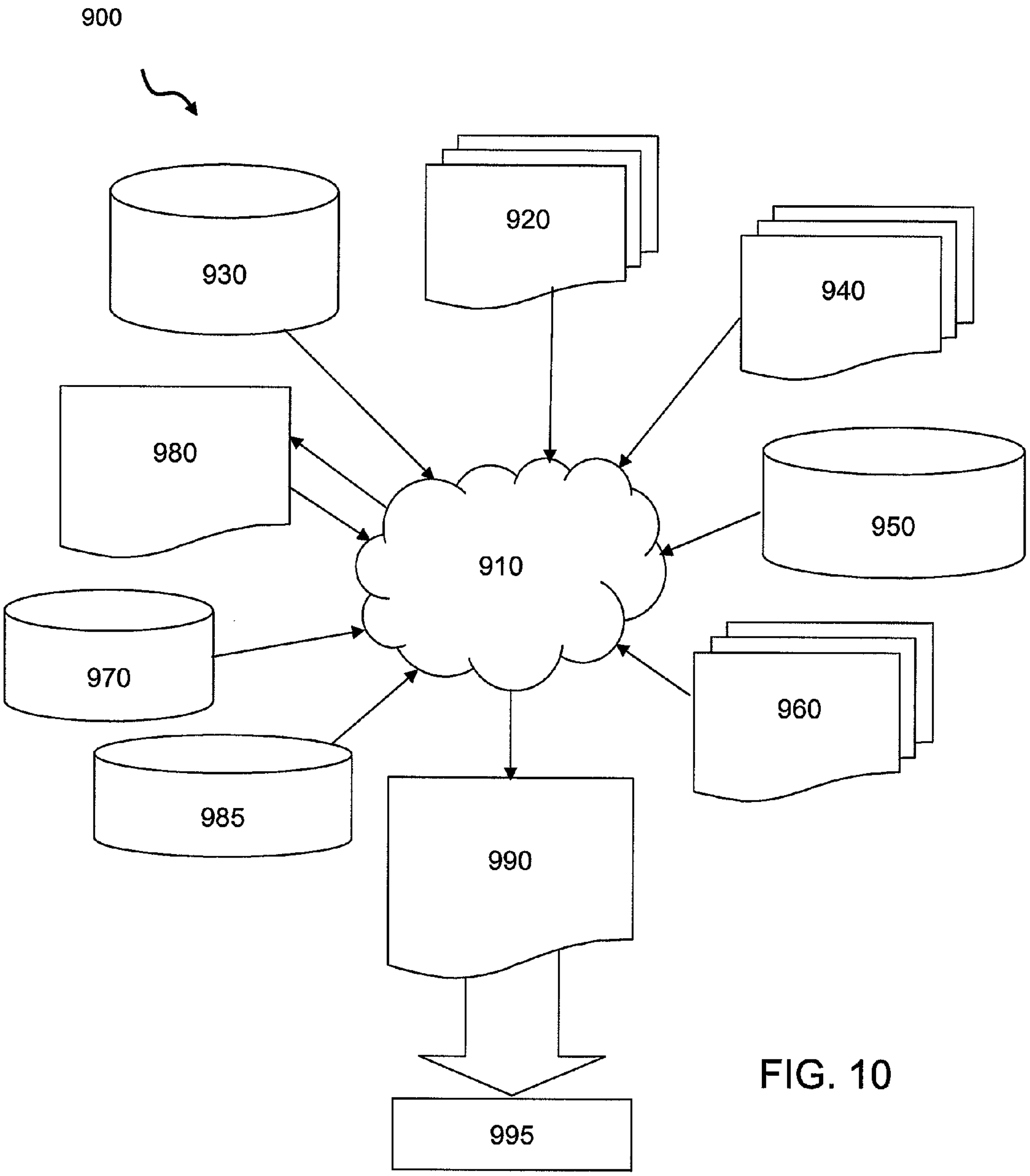
FIG. 10 is a flow diagram of a design process used in semiconductor design, manufacture, and/or test.

FIG. 10 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in, for example, FIGS. 5, 7 and 9 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in, for example, FIGS. 5, 7 and 9. Design process 910 preferably synthesizes (or translates) an embodiment of the invention as shown in, for example, FIGS. 5, 7 and 9 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in, for example, FIGS. 5, 7 and 9, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in, for example, FIGS. 5, 7 and 9. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A design structure comprising a machine readable medium containing instructions which, when executed by a machine, cause the machine to perform operations for designing, manufacturing, or testing an integrated circuit comprising:

a voltage regulator comprising a reference generator, a first operational amplifier comparing a filtered signal to a reference voltage, and a second operational amplifier comparing the filtered signal to a predetermined hard-stop value;

a variable resistor coupled to the voltage regulator; and a performance monitor and control circuit providing a feedback loop to the variable resistor, wherein the control circuit is structured and arranged to adjust the variable resistor to set a resistance of the variable resistor to maximize noise filtering of an analog circuit which receives a voltage from the voltage regulator.

2. The design structure of claim 1, wherein the design structure is one of synthesizable or translatable into a netlist.

3. The design structure of claim 1, wherein the machine readable medium comprises a storage medium as a data format used for the exchange of layout data of the integrated circuit.

4. The design structure of claim 1, wherein the design structure is instantiatable into a programmable gate array.

5. The design structure of claim 1, wherein the control circuit is structured and arranged to increase the resistance of the variable resistor until the analog circuit begins to experience degraded performance.

6. The design structure of claim 5, wherein the control circuit is structured and arranged to decrease the resistance of the variable resistor once performance of the analog circuit begins to degrade, to a resistance value just prior to the resistance value where the analog circuit begins to experience the degraded performance.

7. The design structure of claim 1, wherein the performance monitor comprises a circuit whose performance is affected by supply noise.

8. The design structure of claim 7, wherein the circuit whose performance is affected by the supply noise comprises a phase locked loop.

9. A design structure comprising a machine readable medium containing instructions, which, when executed by a machine, cause the machine to perform operations for designing, manufacturing, or testing an integrated circuit comprising:

a noise filter comprising a variable resistor; and a control device coupled to adjust the variable resistor, wherein the control device is structured and arranged to set a resistance of the variable resistor to one of maximize noise filtering or optimize performance of an analog circuit coupled to the variable resistor, wherein the control device comprises a circuit whose performance is affected by supply noise, and wherein the circuit whose performance is affected by the supply noise comprises a phase locked loop.

10. The design structure of claim 9, wherein the design structure is synthesizable or translatable into a netlist.

11. The design structure of claim 9, wherein the machine readable medium comprises a storage medium as a data format used for the exchange of layout data of the integrated circuit.

12. The design structure of claim 9, wherein the design structure is instantiatable into a programmable gate array.

13. The design structure of claim 9, wherein the control device is structured and arranged to increase the resistance of the variable resistor until the analog circuit begins to experience degraded performance.

14. The design structure of claim 13, wherein the control device is structured and arranged to decrease the resistance of the variable resistor once performance of the analog circuit begins to degrade, to a resistance value just prior to the resistance value where the analog circuit begins to experience the degraded performance.

* * * * *